United States Patent
Yi et al.

(10) Patent No.: US 10,332,884 B2
(45) Date of Patent: Jun. 25, 2019

(54) FINFET SEMICONDUCTOR DEVICE (71) Applicant: UNITED MICROELECTRONICS CORP., Hsin-Chu (TW)

(72) Inventors: Liang Yi, Singapore (SG); Che-Jung Hsu, Taoyuan (TW); Yu-Cheng Tung, Kaohsiung (TW); Jianjun Yang, Singapore (SG); Yuan-Hsiang Chang, Hsinchu (TW); Chih-Chien Chang, Hsinchu (TW); Weichang Liu, Singapore (SG); Shen-De Wang, Hsinchu County (TW); Kok Wun Tan, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/802,450

(22) Filed: Nov. 2, 2017

(65) Prior Publication Data
US 2019/0131302 A1 May 2, 2019

(51) Int. Cl.
| | |
|---|---|
| *H01L 27/092* | (2006.01) |
| *H01L 27/11573* | (2017.01) |
| *H01L 29/792* | (2006.01) |
| *H01L 29/66* | (2006.01) |
| *H01L 29/78* | (2006.01) |

(52) U.S. Cl.
CPC .... *H01L 27/0924* (2013.01); *H01L 27/11573* (2013.01); *H01L 29/66795* (2013.01); *H01L 29/66833* (2013.01); *H01L 29/785* (2013.01); *H01L 29/792* (2013.01)

(58) Field of Classification Search
CPC .......... H01L 27/0924; H01L 27/11573; H01L 29/66795; H01L 29/66833
See application file for complete search history.

(56) References Cited

U.S. PATENT DOCUMENTS

| | | | |
|---|---|---|---|
| 6,058,044 A * | 5/2000 | Sugiura | G11C 16/0483 365/185.17 |
| 7,589,387 B2 | 9/2009 | Hwang | |
| 8,710,578 B2 | 4/2014 | Jenne | |
| 8,901,632 B1 * | 12/2014 | Perera | H01L 29/7831 257/314 |
| 9,496,276 B2 * | 11/2016 | Chuang | H01L 27/11573 |
| 9,583,499 B1 * | 2/2017 | Zhu | H01L 27/11524 |
| 9,853,039 B1 * | 12/2017 | Kang | H01L 27/1157 |
| 2001/0028080 A1 * | 10/2001 | Himeno | H01L 27/115 257/315 |
| 2016/0064507 A1 * | 3/2016 | Amo | H01L 29/4975 257/314 |
| 2016/0379987 A1 * | 12/2016 | Liu | H01L 27/11524 257/316 |
| 2018/0145085 A1 * | 5/2018 | Liu | H01L 29/42328 |

* cited by examiner

*Primary Examiner* — Phuc T Dang
(74) *Attorney, Agent, or Firm* — Winston Hsu (57) ABSTRACT

A method of manufacturing FinFET semiconductor devices in memory regions and logic regions includes the steps of forming a first gate material layer on a substrate and fins, patterning the first gate material layer to form a control gate, forming a second gate material layer on the substrate and fins, performing an etch process to the cell region so that the second gate material layer in the cell region is lower than the second gate material layer in the peripheral region, patterning the second gate material layer to form a select gate in the cell region and a dummy gate in the logic region respectively.

5 Claims, 6 Drawing Sheets

FINFET SEMICONDUCTOR DEVICE

BACKGROUND OF THE INVENTION

1. Field of the Invention

The present invention generally relates to (fin field-effect transistor, FinFET) semiconductor devices, and more particularly, to FinFET semiconductor devices in memory cell regions and logic regions and method of manufacturing the same.

2. Description of the Prior Art

A non-volatile memory, such as Flash memory, retains stored data even if power to the memory is removed. A non-volatile memory cell stores data, for example, by storing electrical charge in an electrically isolated memory gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power application.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during a programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

It is common to monolithically incorporate multiple types of field-effect devices on the same substrate as memory cells. Those non-memory devices perform, for example, decoding, charge-pumping, and other functions related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate memory cell, with the processing of one or more types of non-memory transistors on the same substrate is challenging as each requires different fabrication parameters. Accordingly, there is a need for a manufacturing method which may appropriately integrate the processes for memory cells and peripheral regions.

SUMMARY OF THE INVENTION

The following paragraphs present a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

It is the concept of the present invention to provide a logic-compatible FinFET (fin field-effect transistor) embedded flash process which may manufacture memory and logic devices concurrently in the same process step without impacting the yield and performance of the products. The FinFET scheme may further improve the performance of threshold voltage in embedded flash due to its fully depleted characteristic compared to planar-type ones.

In one aspect of the embodiments, there is provided a semiconductor device including a substrate with memory regions and logic regions, a control gate in the memory region, a select gate adjacent to the control gate, and a metal gate in the logic region, wherein the height of metal gate is higher than the height of select gate and further higher than the height of control gate, and the control gate, the select gate and the metal gate extend over a fin.

In another aspect of the embodiments, there is provided a method of manufacturing semiconductor devices in memory regions and logic regions including the steps of providing a substrate with memory regions and logic regions and a plurality of fins formed thereon, forming a first gate material layer and a hard mask layer on the substrate and fins, patterning first gate material layer and hard mask layer into a control gate extending over the fins, forming a second gate material layer on the substrate and the fins, wherein the top surface of the second gate material layer is flush with the top surface of the hard mask layer, performing an etch process to cell regions, so that the top surface of second gate material layer and the hard mask layer in memory regions are lower than the top surface of second gate material layer in logic regions, patterning second gate material layer into a select gate in the memory region and a dummy gate in the logic region respectively, wherein the select gate and the dummy gate extend over the fins, and removing hard mask layer on the control gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the, regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide and etc. In other embodiments, the substrate may be electrically non-conductive such as a glass or sapphire wafer.

FinFET (fin field-effect transistor) technology takes its name from the fact that the FET structure used looks like a set of fins when viewed. The main characteristic of the FinFET is that it has a conducting channel wrapped by a thin silicon "fin" from which it gains its name. The thickness of the fin determines the effective channel length of the device. In terms of its structure, it typically has a vertical fin on a substrate which runs between a larger drain and source area. This protrudes vertically above the substrate as a fin. This form of gate structure provides improved electrical control over the channel conduction and it helps reduce leakage current levels and overcomes some other short-channel effects.

Figure 11:
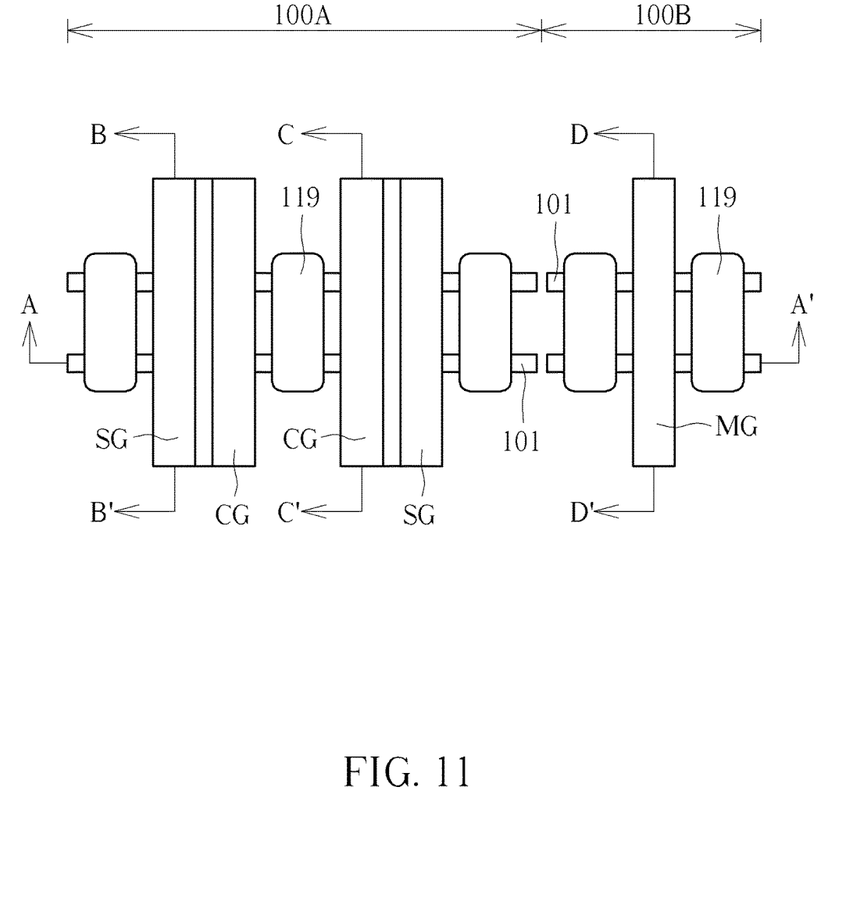
FIG. 11 is schematic top view of the semiconductor device in accordance with an embodiment of the present invention.

FIG. 11 is schematic top view of the semiconductor device in accordance with an embodiment of the present invention. FIG. 11 provides a comprehensive overview for the semiconductor devices formed both in the memory/cell region 100A, such as select gate (SG) and control gates (CG), and the logic region 100B, such as metal gate (MG).

FIGS. 1-9 are cross-sectional views taken along line A-A' in FIG. 11, which explicitly depicts an exemplary process flow of manufacturing semiconductor devices respectively in the memory region and the logic region in accordance with the embodiment of the present invention. The cross-sectional views of FIGS. 1-9 provide the relative positions of components in the semiconductor devices on fins such as gate structures, source/drain and spacer, etc. FIG. 10 is a cross-sectional view including the segments taken along lines B-B', C-C' and D-D' in FIG. 11. The cross-sectional view of FIG. 10 collectively shows the layer structures disposed cross over the fins. It also shows the height difference between three gate structures.

Figure 1:
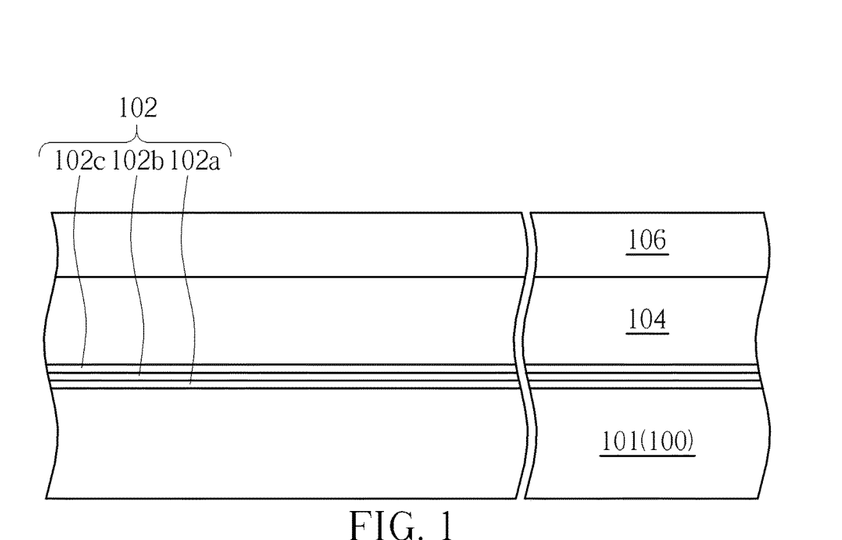
FIGS. 1-9 are cross-sectional views taken along line A-A' in FIG. 11, which depicts an exemplary process flow of manufacturing semiconductor devices respectively in memory regions and logic regions in accordance with the embodiment of the present invention.

First, please refer to FIG. 1. Memory devices are formed preliminarily on a substrate 100, such as silicon substrate. Substrate 100 is commonly p-type or a p-type well while the doped source/drain regions (not shown) are n-type. However, it is also possible for substrate 100 to be n-type while the source/drain regions are p-type. Please note that FIGS. 1-9 are cross-sectional views taken along the fin structure. The substrate 100 shown in FIGS. 1-9 is the portion of fin 101 protruding from the substrate. FIG. 10 clearly shows the manner of fins 101 protruding from the substrate 100.

The substrate 100 is divided into two kinds of main regions 100A and 100B. The memory region 100A of the substrate 100 may be used for disposing the memory devices in the form of cell array. For instance, according to the preferred embodiment, a number of select gate/control gate pairs in a scheme of split-gate-type FinFET embedded flash may be formed in the memory region 100A. Logic circuit and/or other high-voltage devices may be formed in logic regions 100B according to the preferred embodiments. The memory region 100A and the logic region 100B and the semiconductor devices formed on each region are isolated from each other by shallow trench isolation (STI, as 103 in FIG. 10).

As shown in FIG. 1, a gate dielectric layer 102 is formed on each memory region 100A and logic region 100B. According to the preferred embodiments, the gate dielectric layers 102 on different regions may have different thicknesses as shown to meet different device requirements, but this need not be the case. The gate dielectrics can be any insulating material including but not limited to oxides, nitrides, or some combination thereof. Preferably, the gate dielectric layer 102 in the preferred embodiment is an oxide/nitride/oxide tri-layer stacked collectively and commonly referred to as "ONO", which commonly serves as a charge trapping dielectric that includes a charge trapping silicon nitride layer sandwiched between two silicon dioxide layers. Other charge trapping dielectrics may include a silicon-rich nitride film, or any film that includes, but is not limited to, silicon, oxygen, and nitrogen in various stoichiometries. For the sake of convenience to describe the components, the gate dielectric layer 102 is divided into an oxide layer 102a, a nitride layer 102b and an oxide layer 102c in the embodiment. The gate dielectric layer 102 may be formed through any well-known method. For instance, the dielectrics may be grown on the substrate 100 and comprise an oxide of the substrate material (e.g., silicon oxide).

A gate material layer 104 is formed on the gate dielectric layer 102. Any appropriate gate conductor material could be used to form the gate material layer 104 such as a polysilicon, according to the preferred embodiments. The gate material layer 104 may be formed or disposed according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

A hard mask layer 106 is disposed over the gate material layer 104. The hard mask layer 106 may comprise any suitable material that allows for selective removal (e.g., etching) of the unmasked portion of the gate material layer 104. According to the preferred embodiment, the hard mask layer 106 is a silicon nitride (SiN) layer or a silicon carbon nitride (SiCN) layer.

Figure 2:
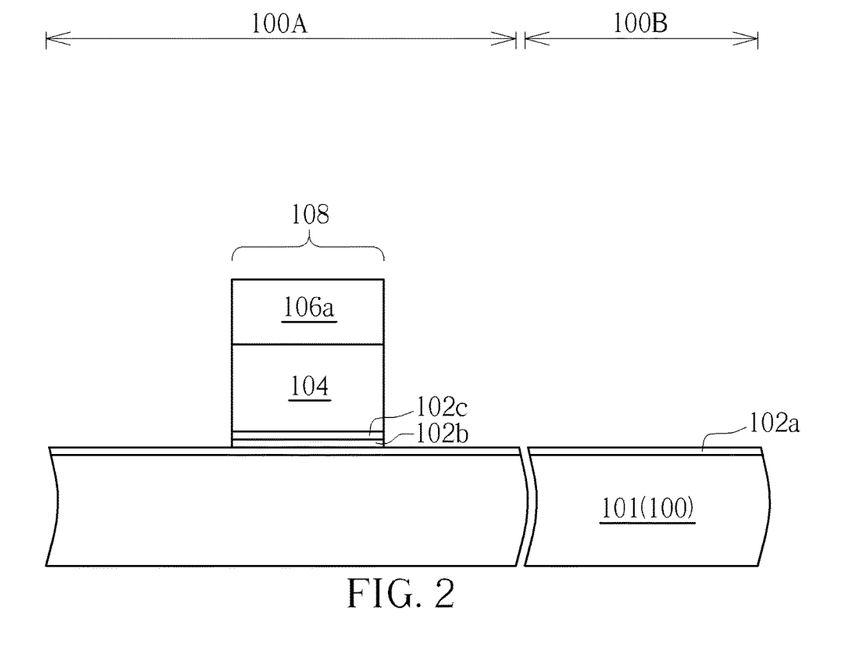

Refer to FIG. 2. After the gate dielectric layer 102, the gate material layer 104 and the hard mask layer 106 are formed, the hard mask layer 106 and the gate material layer 104 in the memory region 100A are patterned to create a control gate 108. This patterning process may comprise several conventional steps. For example, the hard mask layer 106 may be first patterned into hard mask 106a with gate patterns using photoresist. An etch process is then performed with hard mask 106a as an etch mask to pattern the gate material layer 104 and form the control gate 108. Please note that in this embodiment the gate dielectric layer 102 outside the control gate 108 is also partly patterned by the etching process. Only the portion of oxide layer 102a remains on the substrate outside the control gate 108 to serve as a gate dielectric layer for the peripheral region in later process. This is because the control gate 108 requires an ONO tri-layer gate dielectric to trap charges, while other gate structures not. In case of blurring and confusing the key points of the present invention, the above detailed steps of patterning process are not depicted in drawings and the control gate 108 is consequently presented in FIG. 2.

Figure 3:
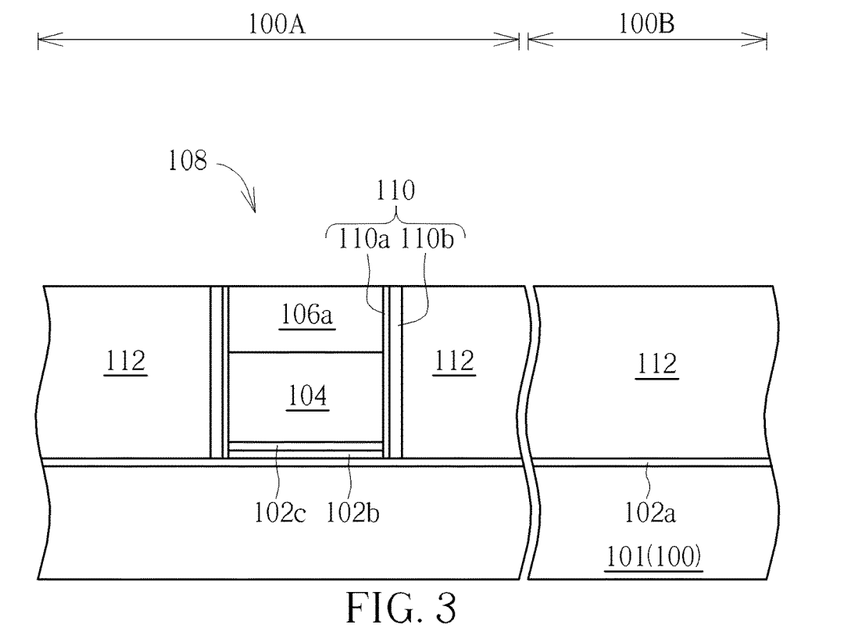

Refer now to FIG. 3. After the control gate 108 is formed, a spacer 110 is formed on the sides of the control gate 108. According to the preferred embodiment, the spacer 110 comprises one or more layers of dielectric such as oxide-nitride (ON), which referred as an ON spacer. The formation of ON spacer 110 may comprise several conventional steps. For example, an oxide layer 110a and a nitride layer 110b may be formed sequentially and conformally over the control gate 108 and the substrate 100 by well-known deposition method. The deposited, conformal oxide layer 110a and nitride layer 110b are then subject to an etch process. The etching process would remove the portion of the oxide layer and nitride layer on the plane, thus only the portion on the sidewall of the control gate 108 is left and the ON spacers 110 are formed by sides of the control gate 108. Preferably, the material of the nitride layer 110b is the same as the hard mask 106a, such as silicon nitride (SiN) or silicon carbide nitride (SiCN), and the oxide layer 110a is silicon oxide.

Refer still to FIG. 3. After the ON spacers 110 are formed, another gate material layer 112 is formed on the substrate 100 to serve as the material of the select gate. The material of gate material layer 112 may be the same as the one of the control gate 108, such as polysilicon. The gate material layer 112 may be formed by first disposing the gate material layer on the substrate by PVD or CVD, then performing a planarization process until the top surface of the gate material layer 112 is level with the top surface of the control gate 108.

Figure 4:
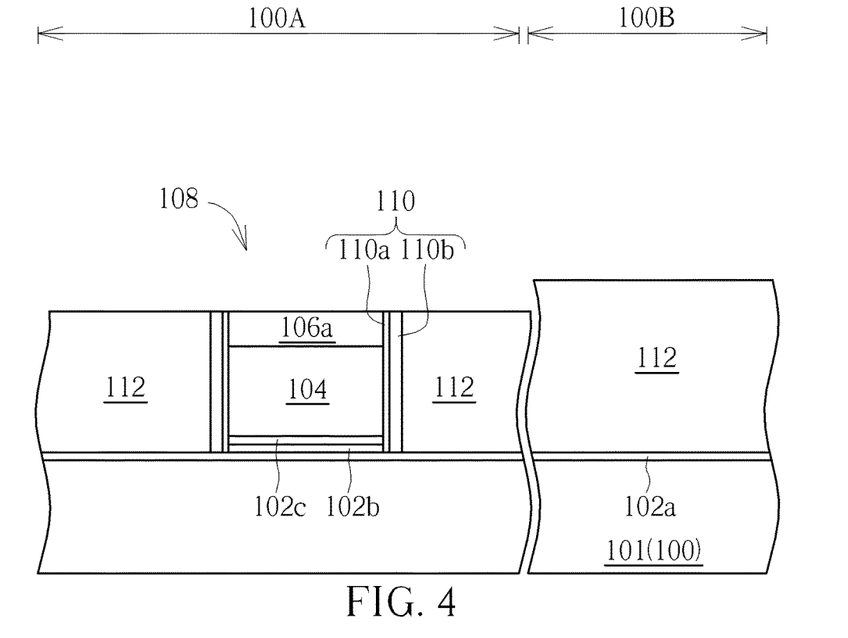

Refer now to FIG. 4. After the gate material layer 112 is formed, a blanket etching back process is performed to only the memory region 100A, so that the top surface of the gate material layer 112, the control gate 108 and the ON spacer 110 in the memory region 100A is lower than the top surface of the gate material layer 112 in the logic region 100B. The process may be performed by masking the peripheral region 100B with a photoresist and then perform the etch process. The purpose of this process is to make the height of the control gate 108 lower than the gate material layer 112 in the peripheral region 100B, so that the control gate 108 will not be impacted by later planarization processes dedicate to the layer structures in the peripheral region 100B. It is seen in FIG. 4 that the thinned hard mask 106a in the control gate 108 is leveled with adjacent gate material layer 112.

Figure 5:
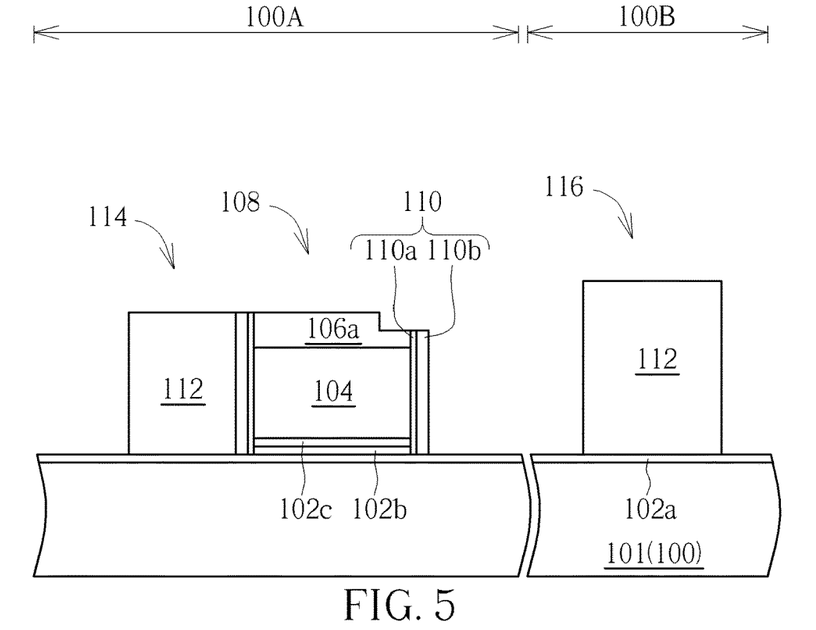

Refer now to FIG. 5. After the height of the control gate 108 is lowered, the gate material layers 112 in the memory region 100A and the logic region 100B are patterned respectively to create a select gate 114 and a dummy gate 116. This patterning process may comprise several conventional steps. For example, a hard mask layer (not shown) may be first forming on the gate material layers 112 and are then patterned into hard mask with the patterns of select gate and dummy gate using a photoresist. An etching process is then performed with hard mask to pattern the gate material layer 104 and form the select gate 114 and the dummy gate 116 concurrently. Alternatively, the select gate 114 and the dummy gate 116 may be formed separately in different patterning processes. The hard mask 106a of the control gate 108 may be slightly etched in this process due to overlay shift of the etch mask. To avoid blurring and confusing the key points of the present invention, the above detailed steps of patterning process are not depicted in drawings and the select gate 114 and the dummy gate 116 are consequently presented in FIG. 5.

It is shown in FIG. 5 that the gate dielectrics of the select gate 114 and the dummy gate 116 is only the oxide layer 102a rather than the ONO tri-layer like the one under the control gate 108. This is because the control gate 108 needs ONO tri-layer dielectrics to function as a charge trapping dielectric for trapping negative electrons and positive holes during programming and erasing operations. Furthermore, the select gate 114 is formed adjacent to the control gate 108 with an ON spacer 110 intervening therebetween, so that the select gate 114 is isolated from the control gate 108. It can also be seen from FIG. 5 that the select gate 114 and the control gate 108 are lower than the dummy gate 116 since the gate material layers 112 in the memory region 100A is thinned in advance in a previous process.

Figure 6:
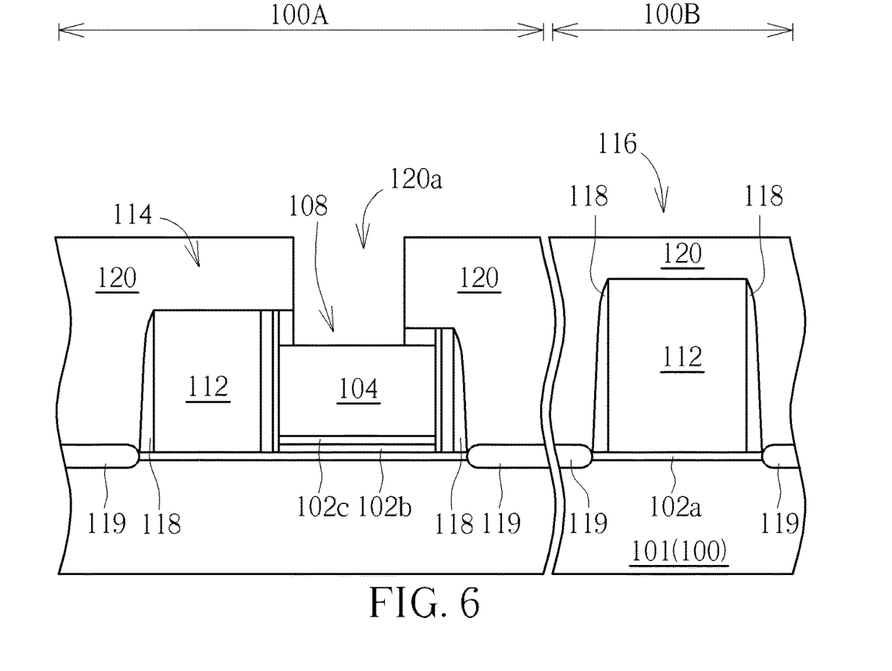

Please refer now to FIG. 6. After the select gate 114 and the dummy gate 116 are formed, spacers 118 are formed on sidewalls of the control gate 108, the select gate 114 and the dummy gate 116 respectively. The spacers 118 may be formed by first forming a space layer conformally over the gate structures by well-known deposition methods. The deposited, conformal spacer layer is then subject to an etching process to remove the portion of the spacer layer on the plane, thus only the portion on the sidewall of the gate structure are left and forms the spacers 118. After the spacers 118 are formed, an Si-based growing process may be performed to grow epitaxial structures 119, such as epitaxial SiGe or SiC, from the substrate/fins 100/101 exposed from the gate structure and the spacers to introduce strain to channel regions. The epitaxial structures 119 formed from adjacent fins may merge in the form as shown in FIG. 11.

Please refer still to FIG. 6. After the spacers 118 are formed, a photoresist layer 120 is blanket covered over the substrate 100. The photoresist layer 120 is provided with an opening 120a which exposes the region of control gate 108. The photoresist layer 120 may be formed on the surface of substrate 100 using conventional deposition techniques. For example, chemical vapor deposition, plasma vapor deposition, sputtering, dip coating, spin-on coating, brushing, spraying and other like deposition techniques may be employed. The hard mask 106a is opened subsequently to expose the top surface of control gate 108 by an etching process with the photoresist layer 120 as the etch mask. A portion of hard mask 106a may remain on the control gate 108 after the process.

Figure 7:
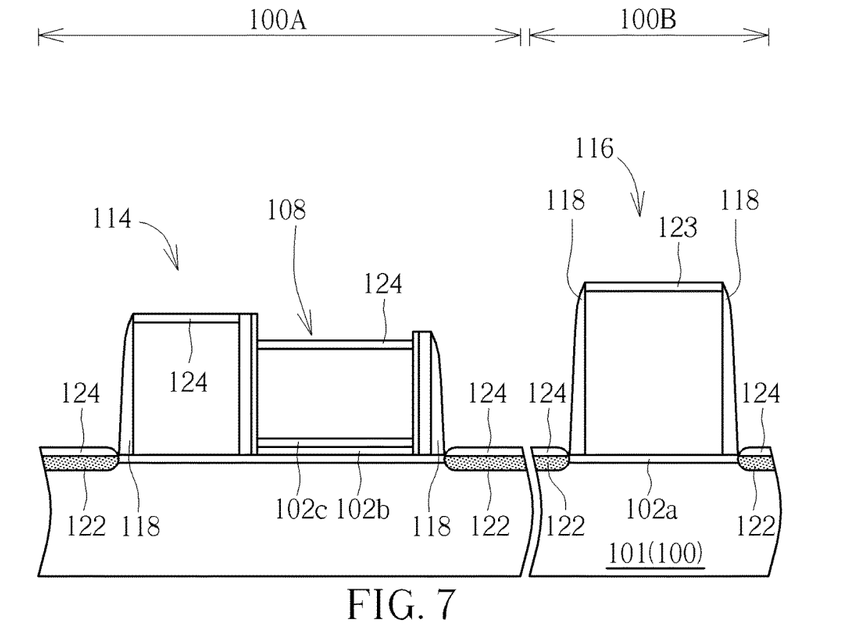

Please refer to FIG. 7. After the top surface of control gate 108 is exposed, the photoresist layer 120 is removed by a stripping process to expose the top surfaces of gate structures and epitaxial structures. An ion implantation process is then performed to dope the epitaxial structures 119 and form elevated source/drain 122 at both sides of the gate structures. Separate processing may be used for the p-channel and n-channel transistors with each of the source and drain regions being grown in different processing steps and subject to in-situ doping. In forming a PMOS transistor, the epitaxial SiGe structure 119 may be used to be selectively in-situ doped with boron (B). Boron concentration of $10^{20}$ cm$^{-3}$ and a germanium concentration of 20% are achieved. A low resistivity resulting from the high boron concentration in the film provides the benefit of high conductivity in the tip source/drain regions. Epitaxial SiGe structure 119 in the source/drain regions exerts compressive strain on the channel, which in turn results in enhanced mobility and improved transistor performance. For an NMOS transistor, the epitaxial SiC structure 119 may be used to be selectively in-situ doped with phosphorous (P). A phosphorous concentration of $2 \cdot 10^{20}$ cm$^{-3}$ is achieved in the deposited film.

Refer still to FIG. 7. After the doped source/drain 122 is formed, a self-aligned block (SAB) 123 may be first formed on the dummy gate 116. The self-aligned block 123 is provided to prevent the formation of silicide on the dummy gate 116 in a later silicide process. A metal silicide process is then performed to form silicide layer 124 on the exposed top surfaces of the select gate 114, the control gate 108 and the source/drain 122. In the embodiment, the metal layer used to form the silicide layer 124 in the silicide process may be composed of nickel or nickel platinum alloy. The metal layer may also include at least one of nickel (Ni), cobalt, (Co), tungsten (W), titanium (Ti), tantalum (Ta), aluminum (Al), platinum (Pt) and combinations thereof. A thermal annealing step may include, but is not limited to, rapid thermal annealing, furnace annealing, laser annealing and combinations thereof to react and convert the metal layer into the metal semiconductor alloy contact silicide layer 124, such as nickel silicide (NiSi). The silicide layer 124 on the source/drain 122 may provide good Schottky-junction between the metal contact and Si-based source/drain 122 in the transistor device and reduce sheet resistance for source/drain.

Figure 8:
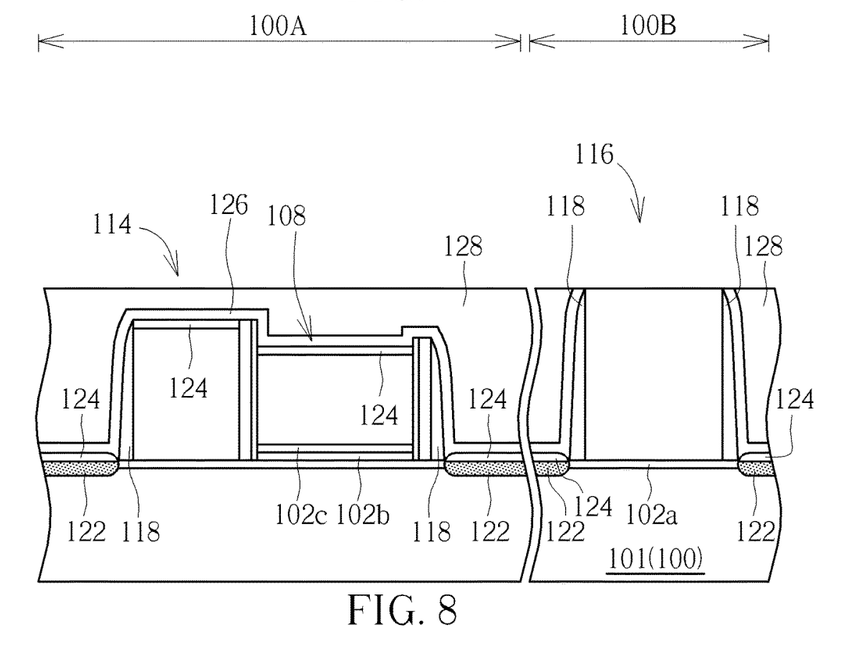

Please refer to FIG. 8. After the source/drain 122 and the silicide layer 124 are formed, a conformal contact etch stop layer (CESL) 126 is formed on the surface. The CESL 126 may comprise, but is not limited to, silicon nitride or carbon-doped silicon nitride with any suitable thickness. The CESL 126 may be deposited using CVD, high density plasma (HDP) CVD, sub-atmospheric CVD (SACVD), molecular layer deposition (MLD), sputtering, or other suitable methods. The CESL 126 may also introduce strain to channel regions to further improve the electrical performance of the devices.

An interlayer dielectric (ILD) layer 128 is subsequently deposited over the CESL 126. The ILD layer 128 may comprise a dielectric material composed of silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), polyimide, and/or combinations thereof. It is understood that the ILD layer 128 may comprise one or more dielectric materials and/or one or more dielectric layers. The ILD layer 128 may be deposited over the CESL 126 to a suitable thickness by CVD, high density plasma (HDP) CVD, sub-atmospheric CVD (SACVD), spin-on, sputtering, or other suitable methods.

Refer still to FIG. 8. A chemical mechanical polishing (CMP) process is subsequently performed to remove and planarize ILD layer 128. The top surface of dummy gate 116 in the logic region 100B will be exposed after the CMP process for the replacement metal gate process to be performed. The CMP process also removes the silicide layer 124 on the dummy gate 116. It is noted that since the select gate 114 and the control gate 108 are lowered in the process shown in FIG. 4, the CMP process would only expose the top surface of higher dummy gate 116 in the logic region 100B without damaging the select gate 114 and the control gate 108 in the memory region 100A. With this approach, the process for the embedded flash in the memory cell may be appropriately compatible with the processes for the logic circuit in the logic region 100B without increasing additional process steps or significantly changing current process flow.

Figure 9:
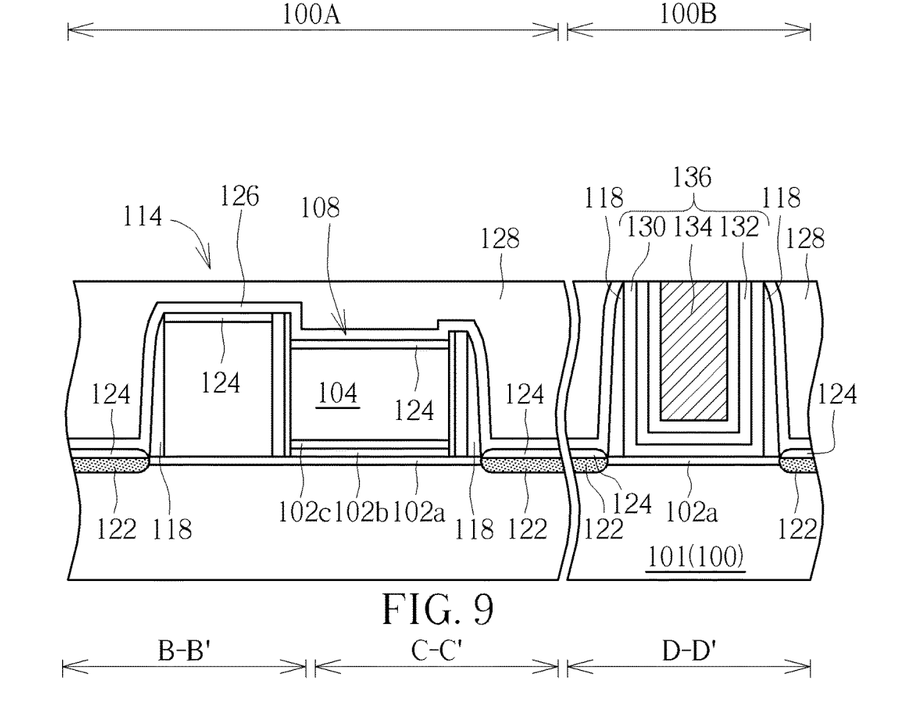
Figure 10:
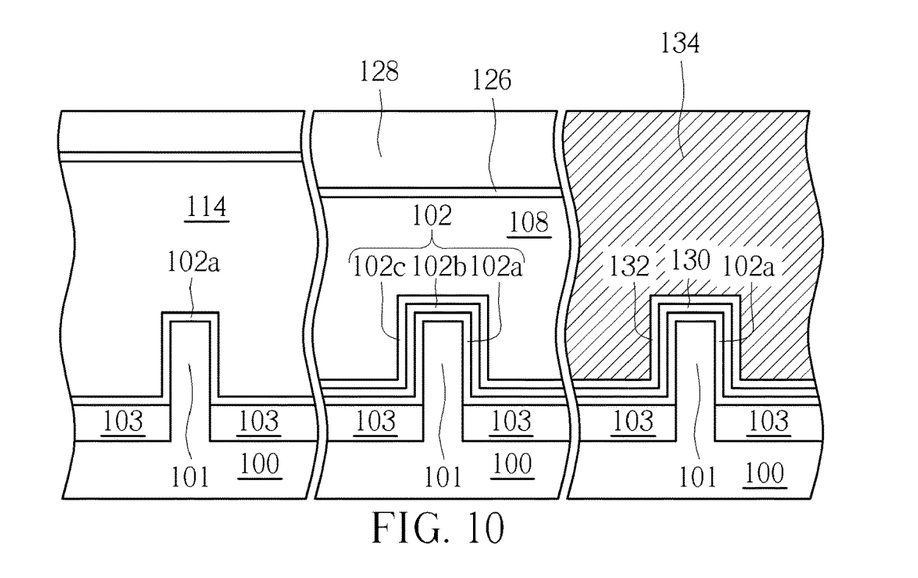
FIG. 10 is a cross-sectional view including the segments taken along lines B-B', C-C' and D-D' in FIG. 11.

Please refer to FIG. 9. After the CMP process, a gate replacement process is performed. The dummy gate 116 is removed to form a trench in the gate structure by any suitable process, including the processes described herein. In preferred embodiments, a wet etch process for the polysilicon dummy gate electrode layer may comprise exposing the dummy gate electrode layer to a hydroxide containing solution (e.g., ammonium hydroxide), deionized water, and/or other suitable etchant solutions.

When the dummy gate 116 is removed, this step results in the formation of a trench surrounded with the dielectrics comprising the pair of spacers 118, CESL 126, and ILD layer 128. After the trench is formed, a barrier layer 130, a work function metal layer 132 and a filling metal layer 134 are sequentially formed in the trench to form the metal gate 136. In the preferred embodiment, the barrier layer 130 may be a titanium nitride (TiN) layer or a titanium aluminium nitride (TiAlN) layer. The material of the work function metal layer 132 may be selected from TiN, tungsten nitride (WN), tantalum nitride (TaN), ruthenium (Ru), TiAlN, Al-doped titanium carbide (TiAlC), tantalum carbide (TaC), tantalum carbide nitride (TaCN), tantalum silicon nitride (TaSiN), manganese (Mn), or zirconium (Zr) and/or combinations thereof, depending on the applied device is P-type MOSFET or N-type MOSFET. The filling metal layer 134 includes materials with low resistance and superior gap-filling characteristics, such as aluminum (Al), silver (Ag), titanium aluminide (TiAl), or titanium aluminum oxide (TiAlO), but not limited to this. There may be other layers such as liner layers, interface layers, seed layers, or adhesion layers formed in the metal gate structure. For simplicity and clarity of the present invention, these components will not be given in the specification and drawing.

It is noteworthy that the preferred embodiment can be integrated with the high-k last process. Before forming the barrier layer 130, work function metal layer 132 and filling metal layer 134 for the metal gate, a high-k dielectric layer (not shown) may be first formed in the trench. The high-k gate dielectric layer includes high-k materials such as rare earth metal oxide, including the material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

After all of the above layer structures are formed, another CMP is performed on the substrate to planarize and remove the unnecessary portion of the barrier layer 130, work function metal layer 132 and filling metal layer 134 outside the gate trench. The metal gate 136 in the peripheral region is therefore formed. It is noted that since the select gate 114 and the control gate 108 are lowered in the process shown in FIG. 4, the CMP process would not damages the select gate 114 and the control gate 108 in the memory region 100A.

Please refer to FIG. 10. FIG. 10 is a cross-sectional view including the segments taken along lines B-B', C-C' and D-D' in FIG. 11. In the preferred embodiment, as shown in FIG. 10, the height of metal gate 136 is higher than the height of select gate 114 and further higher than the height of control gate 108. In the segment of control gate 108, the gate dielectric of ONO tri-layer stacked for trapping the storage charges is between the control gate 108 and the fin 101. In the segment of select gate 114, only the oxide layer 102a serves as the gate dielectric. In the segment of metal gate 134, there may be the oxide layer 102a, the barrier layer 130 and the work function layer 132 between the metal gate 134 and the fin 101. Please note that, for simplicity and clarity of the present invention, FIG. 10 only shows one fin 101 in each gate segment.

As device scaling is entering the sub-25 nm range, multiple gate device architectures are needed to fulfill the ITRS (International Technology Roadmap for Semiconductors) requirements, since they offer a greatly improved electrostatic control of the channel. The combination of FinFET multiple gate scheme and the split gate type embedded flash memory scheme is achieved in the present invention by the logic-compatible process to further improve the electrical performance of the semiconductor devices, such as the gate threshold voltage distribution, power consumption, read speed and etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate with a memory region and a logic region;

a control gate in said memory region on said substrate;

a select gate adjacent to said control gate in said memory region on said substrate;

a metal gate in said logic region on said substrate, wherein height of said metal gate is higher than height of said select gate and the height of said select gate is further higher than height of said control gate, bottom of said control gate is higher than bottom of said select gate, and said control gate, said select gate and said metal gate extend over a fin; and an interlayer dielectric layer on said memory region and said logic region, wherein said interlayer dielectric layer is flush with said metal gate and covers on said control gate and said select gate.

2. The semiconductor device of claim 1, further comprising an oxide-nitride spacer between said control gate and said select gate, wherein said oxide-nitride spacer comprises an oxide layer and a nitride layer.

3. The semiconductor device of claim 2, wherein said nitride layer comprises silicon nitride (SiN) or silicon carbide nitride (SiCN).

4. The semiconductor device of claim 1, further comprising a gate dielectric layer between said control gate and said substrate and between said select gate and said substrate, wherein said gate dielectric layer between said control gate and said substrate is oxide/nitride/oxide tri-layer.

5. The semiconductor device of claim 1, wherein said control gate and said select gate comprise polysilicon.

* * * * *